United States Patent
Woo et al.

(10) Patent No.: US 8,723,321 B2
(45) Date of Patent: May 13, 2014

(54) COPPER INTERCONNECTS WITH IMPROVED ELECTROMIGRATION LIFETIME

(75) Inventors: Christy Woo, Cupertino, CA (US); Jun "Charlie" Zhai, San Jose, CA (US); Paul Besser, Sunnyvale, CA (US); Kok-Yong Yiang, Sunnyvale, CA (US); Richard C. Blish, Saratoga, CA (US); Christine Hau-Riege, Fremont, CA (US)

(73) Assignee: GLOBALFOUNDIES Inc., Grand Cayman (KY)

( * ) Notice: Subject to any disclaimer, the term of this patent is extended or adjusted under 35 U.S.C. 154(b) by 1246 days.

(21) Appl. No.: 11/448,788

(22) Filed: Jun. 8, 2006

(65) Prior Publication Data

US 2007/0284748 A1 Dec. 13, 2007

(51) Int. Cl.
*H01L 23/48* (2006.01)
*H01L 23/52* (2006.01)
*H01L 29/40* (2006.01)

(52) U.S. Cl.
USPC .................................. 257/758; 257/E23.144

(58) Field of Classification Search
USPC .......................................... 257/758, E23.144
See application file for complete search history.

(56) References Cited

U.S. PATENT DOCUMENTS

| | | | | |
|---|---|---|---|---|
| 6,037,547 A | * | 3/2000 | Blish, II | 174/264 |
| 6,455,415 B1 | * | 9/2002 | Lopatin et al. | 438/628 |
| 7,188,322 B2 | * | 3/2007 | Cohn et al. | 716/2 |
| 7,404,167 B2 | * | 7/2008 | Chuang et al. | 716/52 |
| 2001/0038147 A1 | * | 11/2001 | Higashi et al. | 257/750 |
| 2002/0024115 A1 | * | 2/2002 | Ibnabdeljalil et al. | 257/620 |
| 2002/0162079 A1 | * | 10/2002 | Igarashi et al. | 716/2 |
| 2002/0182855 A1 | * | 12/2002 | Agarwala et al. | 438/638 |
| 2003/0094696 A1 | * | 5/2003 | Dunham et al. | 257/758 |
| 2004/0150070 A1 | * | 8/2004 | Okada et al. | 257/508 |
| 2004/0173803 A1 | * | 9/2004 | Kim | 257/81 |
| 2004/0210862 A1 | * | 10/2004 | Igarashi et al. | 716/13 |
| 2004/0245645 A1 | * | 12/2004 | Miyamoto et al. | 257/758 |
| 2005/0098348 A1 | * | 5/2005 | Okumichi et al. | 174/262 |
| 2005/0275103 A1 | * | 12/2005 | Fischer et al. | 257/758 |
| 2006/0022341 A1 | * | 2/2006 | Sir et al. | 257/758 |
| 2006/0040491 A1 | * | 2/2006 | Lim et al. | 438/637 |
| 2006/0081988 A1 | * | 4/2006 | Dunham et al. | 257/752 |
| 2006/0188824 A1 | * | 8/2006 | Chuang et al. | 430/313 |
| 2007/0087555 A1 | * | 4/2007 | Greco et al. | 438/618 |
| 2007/0212870 A1 | * | 9/2007 | Yang et al. | 438/618 |
| 2007/0246796 A1 | * | 10/2007 | Guo et al. | 257/529 |
| 2007/0278681 A1 | * | 12/2007 | Yu et al. | 257/758 |

\* cited by examiner

*Primary Examiner* — Matthew Landau
*Assistant Examiner* — Igwe U Anya
(74) *Attorney, Agent, or Firm* — Ditthavong Mori & Steiner, P.C.

(57) ABSTRACT

The peeling stress between a Cu line and a capping layer thereon, after via patterning, is reduced by varying the shape of the via and positioning the via to increase the space between the via and the line edge, thereby increasing electromigration lifetime. Embodiments include varying the shape of the via, as by forming an oval or rectangular shape via, such that the ratio of the minor axis of the oval to the line with or the ratio of the width of the rectangle to the line width is less than about 0.7.

20 Claims, 9 Drawing Sheets

COPPER INTERCONNECTS WITH IMPROVED ELECTROMIGRATION LIFETIME

FIELD OF THE INVENTION

The present invention relates to a semiconductor device comprising a highly reliable copper interconnect structure with improved electromigration resistance. The present invention is applicable to flash memory devices having high speed integrated circuits, particularly integrated circuits having design features in the deep sub-micron range.

BACKGROUND ART

As integrated circuit geometry continues to plunge into the deep sub-micron regime, it becomes increasingly difficult to satisfy the requirements of high performance microprocessor applications for both reliability and rapid circuitry speed. One way to increase the control speed of semiconductor circuitry is to reduce the resistance of a conductive pattern. Copper (Cu) is considered a viable alternative to aluminum (Al) for metallization patterns, particularly for interconnect systems having smaller dimensions. Cu has a lower bulk resistivity and potentially higher electromigration tolerance than Al. Both the lower bulk resistivity and higher electromigration tolerance improve circuit performance. A conventional approach to forming a Cu interconnection involves the use of damascene processing in which openings are formed in an interlayer dielectric (ILD) and then filled with Cu. Such damascene techniques typically include single as well as dual damascene techniques, the latter comprising forming a via opening in communication with a trench opening and simultaneously filling by metal deposition to form a via in communication with a metal line.

However, Cu is a mid-gap impurity in silicon and silicon dioxide. Accordingly, Cu diffusion through interlayer dielectrics, such as silicon dioxide, degrades the performance of the integrated circuit. A conventional approach to the diffusion problem comprises depositing a barrier material to encapsulate the Cu line. Typically diffusion barrier materials include tantalum (Ta), tantalum nitride (TaN), titanium nitride (TiN), titanium-tungsten (TiW), tungsten nitride (WN), Ti—TiN, Titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between the Cu and the ILD, but includes interfaces with other metals as well. In depositing Cu by electroless deposition or electroplating, a seedlayer is also typically deposited to catalyze electroless deposition or to carry electric current for electroplating. For electroplating, the seedlayer must be continuous. However, for electroless plating, very thin catalytic layers can be employed in the form of eyelets.

Conventional Cu interconnect methodology typically comprises planarizing after Cu deposition, as by chemical-mechanical polishing (CMP), such that the upper surfaces of the filled trenches are substantially coplanar with the upper surface of the ILD. Subsequently a capping layer, such as silicon nitride, is deposited to complete encapsulation of the Cu inlaid metallization. However, adhesion of such a capping layer as to the Cu inlaid metallization has been problematic, and Cu diffusion along the surface of the interface with the capping layer has been found to be a major cause of electromigration failure. There have evolved methods of addressing the capping layer adhesion problem, as by treating the planarized surface of inlaid copper with a plasma containing hydrogen or ammonia to reduce the thin film of copper oxide formed thereon, thereby improving capping layer adhesion.

As device dimensions continue to plunge, there has been observed delamination at the interface between inlaid Cu and a capping layer, such as a nitride capping layer, occurring after patterning a via hole to the underlying line. This delamination between inlaid Cu and the capping layer causes void formation eventually leading to premature electromigration failure.

Accordingly, there exists a need for reliable semiconductor devices comprising Cu metallization with improved electromigration resistance. There exists a particular need for such reliable semiconductor devices having Cu metallization methodology with improved electromigration resistance comprising metal levels with varying line widths in the deep sub-micron regime.

DISCLOSURE OF THE INVENTION

An advantage of the present invention is a semiconductor device containing Cu metallized interconnection patterns, exhibiting improved electromigration resistance.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising: a dielectric layer having an opening therein; a copper (Cu) or a Cu alloy line in the opening, the Cu or Cu alloy line having an end surface with a width ("LW") defined by first and second side surfaces; a capping layer on the Cu or Cu alloy line; and a via through the capping layer contacting the Cu or Cu alloy line, the via having the form of a rectangle having a width ("RW") substantially parallel to LW or an oval having a minor axis ("MA") substantially parallel to LW, wherein the ratio RW:LW or MA:LW is less than or equal to about 0.7.

Embodiments of the present invention include forming the via such that the ratio RW:LW or MA:LW is about 0.5 to about 0.7. Embodiments of the present invention also include forming the via such that the ratio of the distance between a point on the perimeter of the via closest to the first side surface to the distance between a point on the perimeter of the via closest to the second side surface is about 0.9 to about 1.1, such as about 1. Embodiments of the present invention further include forming the via such that the distance between the end surface of the line and a point on the perimeter of the via closest to the end surface is greater than the distance between the points on the perimeter of the via closest to each side surface. Embodiments of the present invention also include forming the dielectric layer from any of various dielectric materials, such as silicon oxide derived form tetraethyl or orthosilicate (TESO) for flash memory products. Embodiments of the present invention include forming the dielectric layer from a material having a low dielectric constant (k) of no greater than 3.9. Embodiments of the present invention also include cappling layers formed from silicon nitride and materials having a low dielectric constant (k), such as silicon carbide (Blok) and silicon carbide containing less than 10 at. % nitrogen (N-block).

Another aspect of the present invention is a semiconductor device comprising: a dielectric layer having an opening therein; a copper (Cu) or a Cu alloy in the opening, the Cu or Cu alloy line having an end surface with a width ("LW") defined by first and second side surfaces; a capping layer on the Cu or Cu alloy line; and a via through the capping layer contacting the Cu or Cu alloy line, the via having a longest dimension ("LD") parallel to LW, wherein the via has a shape such that the ratio LD:LW is less than the ratio D:LW for a circular via having a diameter ("D") and an area equal to or less than the area of the via.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
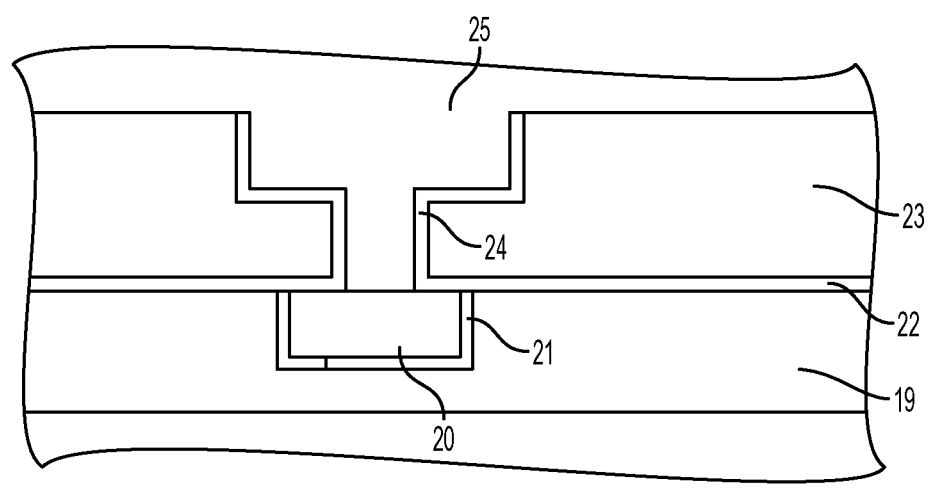
FIGS. 1 and 2 schematically illustrate sequential phases of conventional methodology in forming Cu interconnects.
Figure 2:
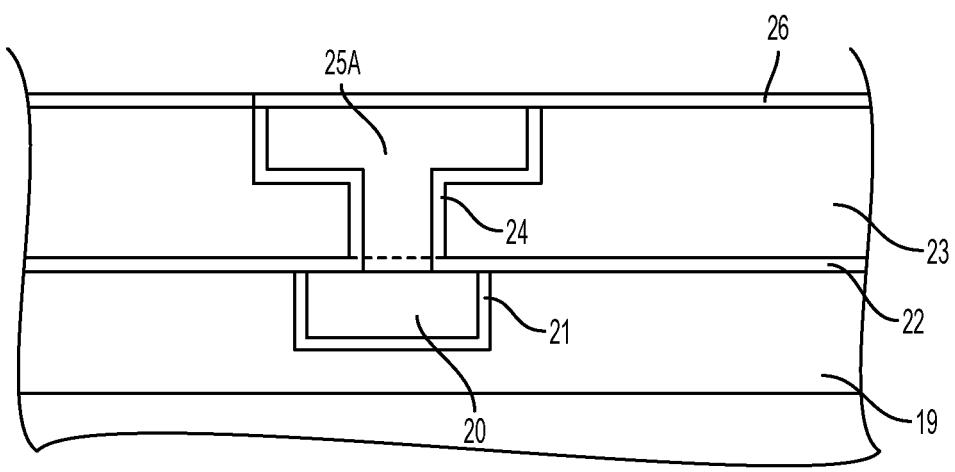

The present invention addresses and solves problems attendant upon forming Cu interconnections, particularly when forming a via to a Cu line through a capping layer. For example, there is schematically illustrated in FIG. 1 an upper portion of an interconnect structure which comprises an interlayer dielectric (ILD) 19, such as a low-k interlayer dielectric, having an inlaid Cu line 20 therein. Reference character 21 denotes a diffusion barrier material, such as tantalum, tantalum nitride, tungsten or tungsten nitride. A capping layer 22, such as silicon nitride, is deposited on the upper surface of inlaid Cu 20. Another ILD 23, such as another low-k dielectric layer, is deposited at an upper interconnect level, a dual damascene opening, having a lower via opening an upper trench portion, is formed therein, and a diffusion barrier 24, such as tantalum or tantalum nitride, titanium or titanium nitride, deposited to line the opening. Etching is then implemented through capping layer 22 to expose the upper surface of inlaid Cu line 20 to the via opening. A layer of Cu 25 is then deposited forming an over burden. Adverting to FIG. 2, wherein elements corresponding to those in FIG. 1 bear similar reference characters, CMP is implemented to form an inlaid Cu 25A, and a capping layer 26, such as silicon nitride, is deposited.

Upon investigating failed or rejected semiconductor devices, it was found that delamination between the Cu metal top surface of Cu line 20 and capping layer 22 occurred subsequent to patterning a via opening extending into the Cu line 20. Such delamination at the Cu/capping layer interface results in the generation of voids, eventually leading to premature electromigration failure. The primary weak surface responsible for electromigration failures is the interface between the Cu and capping layer. Rapid diffusion of Cu along this interface causes electromigration failures in both wide and narrow lines.

There exists a peeling stress at the interface of a Cu metal line and the overlying capping layer, such as silicon nitride. This Cu/nitride capping layer interface is disrupted during via patterning to form a contact connecting the upper metal layer to the underlying metal line. The interfacial peeling stress between the upper surface of the Cu metal line and the overlying capping layer increases after via patterning.

Figure 3A:
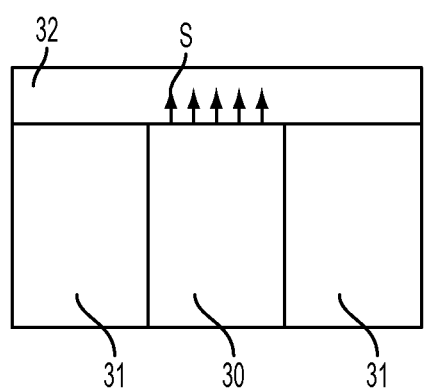
FIGS. 3A and 3B schematically illustrate the distribution of peeling stress upon via patterning.
Figure 3B:
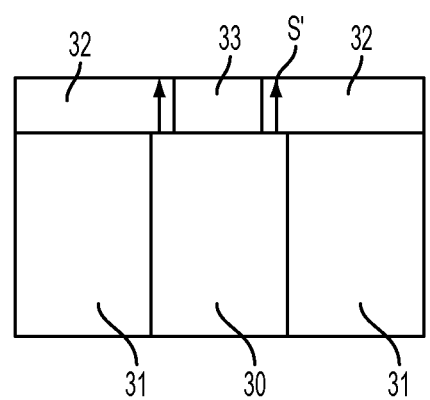

For example, adverting to FIG. 3A, an inlaid Cu line 30 is formed in interlayer dielectric (ILD) 31, with a silicon nitride capping layer 32 thereon. The peeling stress, illustrated by arrows S, is distributed over a relatively larger interface area, i.e., the upper surface of inlaid Cu line 30. However, subsequent to via patterning, the same amount of peeling stress, illustrated by arrows S', is now distributed over a smaller interface area due to via opening 33, resulting in an increase in stress magnitude at the remaining interface, as illustrated in FIG. 3B. When this peeling stress exceeds the bonding energy holding Cu line 30 and capping layer 32 together, the capping layer 32 peels away from the underlying Cu line 30, creating an initial void which continues to grow and eventually results in electromigration failure.

Investigations were conducted, including stress modeling simulation, employing conventional finite element analysis (FEA) using ANSYS software to simulate the stress field resulting from the back end of line processing and thermal loading. FEA is a conventional standard method to analyze the stress-strain and mechanical deformation of a structure or materials under complicated loading conditions.

In conducting such stress modeling simulation it was found that the peeling stress between the Cu line and the capping layer depends on the via size, or surface area contacting the metal line, and the width of the Cu line, and how they are situated with respect to each other. The stress modeling simulation showed that the highest peeling stress occurred at the region where the space between the via and line edge is the smallest However, when the via is positioned further away from the edge of the line, peeling stress decreases.

Figure 4:
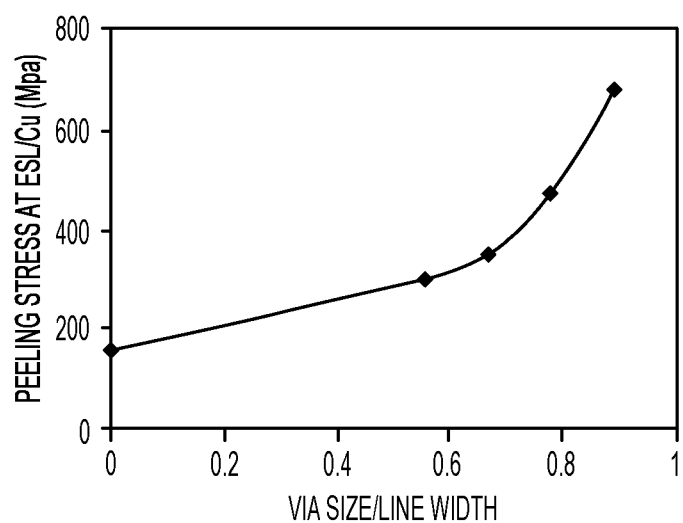
FIG. 4 is a plot illustrating peeling stress at the Cu/capping layer interface as a function of the ratio of a circular via diameter to line width.

FIG. 4 is a plot generated by stress modeling simulation showing the peeling stress at the capping layer/Cu line interface with respect to different ratios of a circular via diameter to line width. The peeling stress is lowest when there is no via present. For a given Cu line width, as the via diameter increases, the ratio of the via size/line width increases thereby generating an increase in the peeling stress. As illustrated in FIG. 4, the slope of the peeling stress becomes steeper when the via diameter passes a certain size. In the simulation, the via size/line width ratio at which the slope of the stress increase becomes steeper occurs at about 0.6 to 0.7.

The present invention addresses and solves the delamination occurring between an inlaid Cu line and overlying capping layer after via patterning by strategically positioning the via and/or forming the via with a geometric shape such that the peeling stress is reduced. In accordance with embodiments of the present invention, a Cu line is formed having an end surface and a width ("LW") defined by first and second side surfaces, and the via is formed having a shape and dimensions such that the ratio of a longest dimension ("LD"), i.e., a via dimension that extends closest to one or both the first and second side surfaces, parallel to LW, i.e., LD:LW, is less than or equal to about 0.7, such as about 0.5 to about 0.7, e.g., about 0.6 to about 0.7. It should be understood that the actual longest dimension of the via typically extends parallel to the length of the Cu line. However, the via may have any shape and LD is the longest dimension of the via that extends parallel to LW, i.e.; closest to one or both side surfaces. Embodiments of the present invention include forming the via having a geometric shape in the form of a rectangle with a width ("RW") substantially parallel to LW such that the RW constitutes LD, or in the form of an oval having a major axis and a minor axis ("MA") substantially parallel to LW, such that MA constitutes LD. Embodiments include oval vias having a major axis: minor axis ratio of 2:1 and greater.

Embodiments of the present invention further include positioning the via with respect to the metal line such that the ratio of the distance between a point on the perimeter of the via closest to the first side surface to the distance between a point on the perimeter of the via closest to the second side surface is about 0.9 to about 1.1, e.g., about 1.0. In addition, in accordance with embodiments of the present invention, the via is strategically positioned such that the distance between the end surface and a point on the perimeter of the via closest to the end surface is greater than the distance between the points on the perimeter of the via closest to each side surface of the metal line.

In accordance with embodiments of the present invention, the via is formed with a geometric shape such that the ratio LD:LW of the via is less than the ratio D:LW for a circular via having a diameter D and an area equal to or less than the area of the geometric via. In this way, a circular via can be replaced with a different geometric form, such as a rectangle or oval, and the length of the oval (major axis) or length of the rectangle extended so that the area of the via is greater than that of a circular via, thereby lowering the current density flowing from the Cu line through the via and, hence, further increasing the electromigration lifetime.

Figure 5:
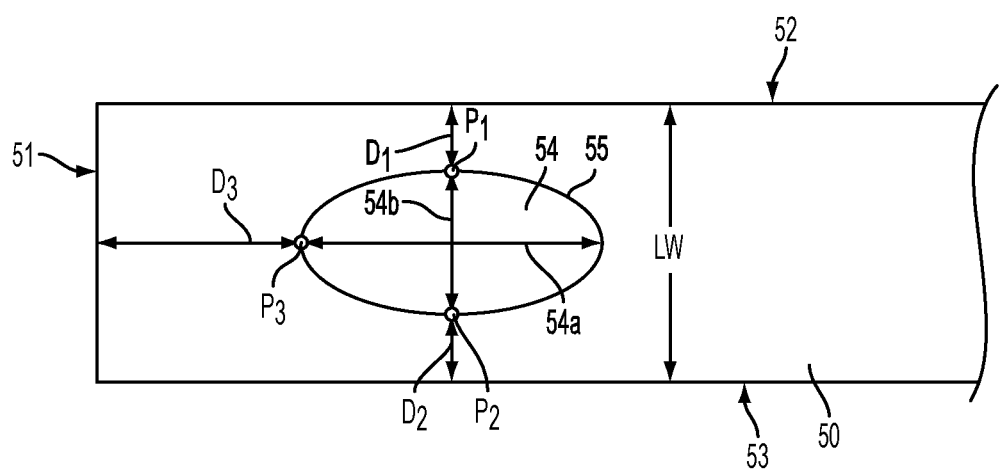
FIG. 5 schematically illustrates an embodiment of the present invention with an oval shaped via.

An embodiment of the present invention is schematically illustrated in FIG. 5 wherein a Cu line 50 is illustrated having an end surface 51, and first and second side surfaces 52 and 53, respectively. An oval via 54 is formed therein having a major axis 54a and a minor axis 54b, the minor axis 54b being parallel to the width LW of metal line 50. Point $P_1$ is a point on the perimeter 55 of oval via 54 closest to first side surface 52, while point $P_2$ is a point on the perimeter 55 of oval via 54 closest to second side surface 53 of line 50. In accordance with embodiments of the present invention the ratio of either $D_1/D_2$ or $D_2/D_1$ is about 0.9 to about 1.1, e.g., about 1.0. The distance $D_3$ between point $P_3$, a point on the perimeter 55 of oval via 54 closest to edge 51 of metal line 50, is greater than $D_1$ and greater than $D_2$, to avoid increasing the peeling stress at edge 51 and attendant electromigration issues at that location.

Figure 6:
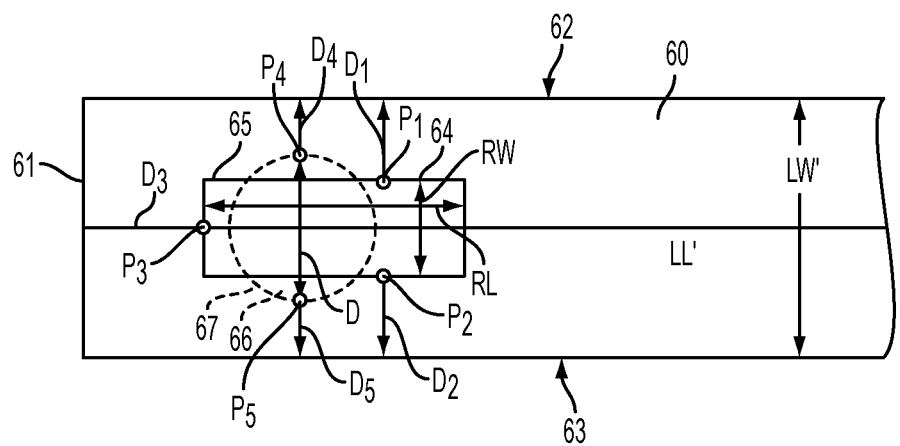
FIG. 6 schematically illustrates an embodiment of the present invention with a rectangular shaped via vis-à-vis a circular via.

Another embodiment of the present invention is schematically illustrated in FIG. 6 illustrating Cu metal line 60 having an edge 61, and first and second side surfaces 62 and 63, respectively. In accordance with an embodiment of the present invention, a rectangular via 64 is formed having a length RL parallel to the length LL' of metal line 60 and a width RW parallel to the width LW' of metal line 60. As in the embodiment illustrated in FIG. 5, the distance $D_1$ between a point $P_1$ on the perimeter 65 of rectangular via 64 closest to first side surface 62 is substantially the same as the distance $D_2$ between a point $P_2$ on the perimeter 65 of rectangular via 64 closest to second side surface 63, the ratio of either $D_1$ or $D_2$ to the other being about 0.9 to about 1.1. The distance $D_3$ from a point $P_3$ on the perimeter 65 of rectangular via 64 closest to the end surface is greater than distance $D_1$ and greater than distance $D_2$. Also schematically illustrated in FIG. 6 is a hypothetical circular via 66 having a diameter D and an area either equal to or less than that of rectangular via 64. With respect to such a hypothetical circular via 66, the ratio RW:LW' of the rectangular shaped via 64 is less than the ratio D:LW' for circular via 66. Further, the distance $D_4$ between a point $P_4$ on the perimeter 67 of circular via 66 closest to first side surface 62 is less than $D_1$, while distance $D_5$ between a point $P_5$ on perimeter 67 of circular via 66 closest to second side surface 63 is less than $D_2$.

Figure 7A:
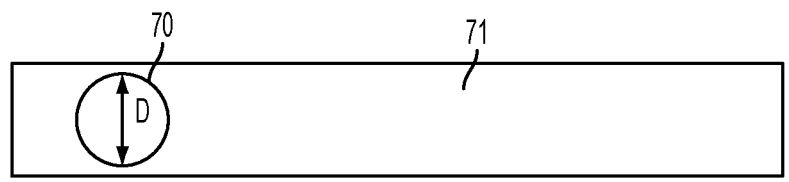
FIG. 7A illustrates a conventional circular via.
Figure 7B:
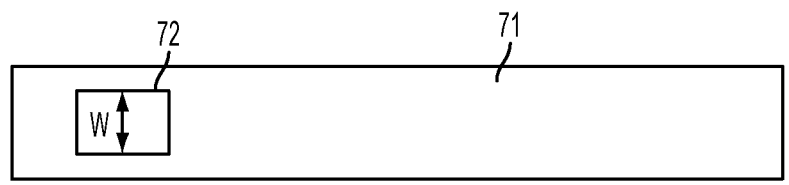
FIG. 7B illustrates the use of a rectangular via in accordance with the present invention vis-à-vis a circular via.
Figure 7C:
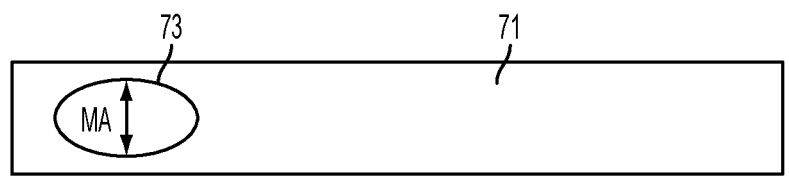
FIG. 7C illustrates an embodiment of the present invention employing an oval via vis-à-vis a circular via.

FIGS. 7A, 7B and 7C illustrate how the change in via shape lowers the peeling stress as a result of lower via side/line width ratio based upon stress simulation. Adverting to FIG. 7A, a circular via 70 is formed in metal line 71. Circular via 70 has a diameter ("D") of about 90 nm and metal line 71 has a width of 120 nm. Circular via 70 yields a via diameter D/line width ratio of 0.75, which is within the steep slope peeling stress region shown in FIG. 4. When circular via 70 is replaced by a rectangular via 72 having a length of 90 nm and a width ("W") of 71 nm, as shown in FIG. 7B, the resulting via width W/line width ratio drops to 0.59. Thus, the change in via shape lowers the peeling stress as a result of a lower via width/line width ratio. Similarly, upon replacing circular via 71 with an oval via 73, having a major axis/minor axis ratio of 2:1 with a minor axis ("MA") being 61 nm, as shown in FIG. 7C, the resulting via minor axis MA/line width ratio drops to 0.53, thereby lowering the peeling stress. In FIGS. 7B and 7C, the distance between the rectangular via 72 and oval via 73, respectively, and the side surfaces of the metal line 71 would be greater than the distance between circular via 70 and the side surfaces of metal line 71, noting that metal line 71 is not drawn to scale.

Figure 8:
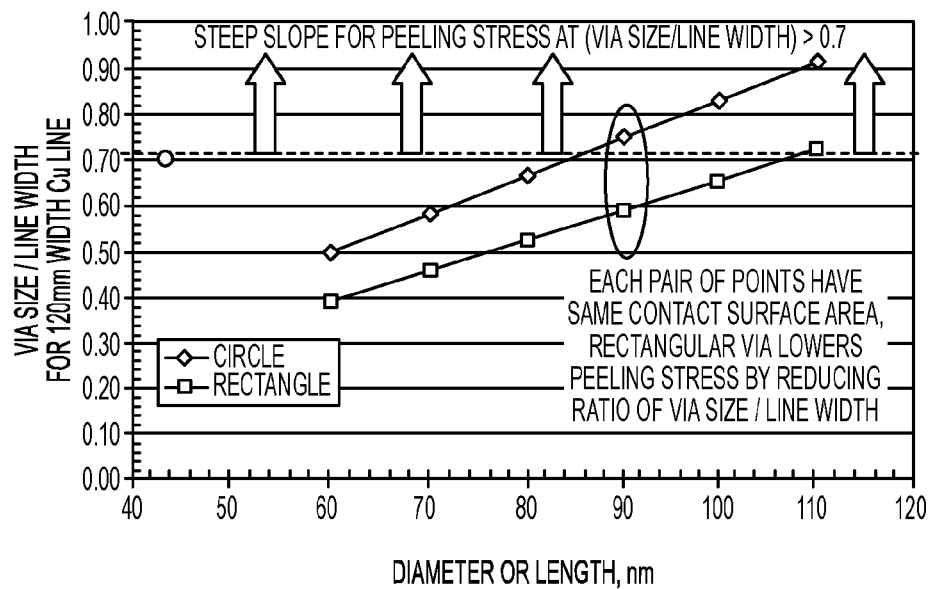
FIG. 8 is a plot showing a comparison of circular to rectangular vias and corresponding via size/line width ratio.

FIG. 8 is a plot illustrating a circular via at different diameters through a Cu line having a width of 120 nm, and the corresponding via diameter/line width ratio. Based upon FIG. 8, which is also generated by stress modeling simulation, when the circular via is replaced by a rectangular via with a length equivalent to the diameter of the circular via and a contact surface area equivalent to the contact surface area of the circular via, the via width/line width ratio drops below the via diameter/line with ratio. The lower ratio provides greater space between the via and the side surfaces of the line, thereby reducing the peeling stress between the inlaid Cu line and the capping layer.

Figure 9:
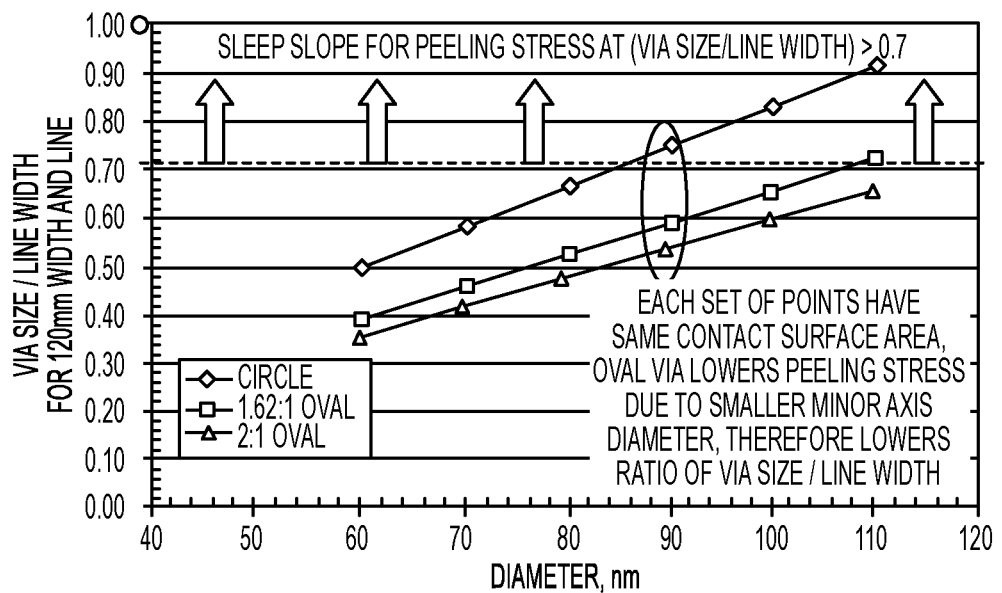
FIG. 9 is a plot showing a comparison of circular via to an oval via at different diameters and corresponding via size/line width ratio.

FIG. 9, also based upon stress modeling simulation, is a plot of a circular via at different diameters and the corresponding via diameter/line width ratio. There are also illustrated two lines showing a 1.62:1 and 2:1 oval via. For each circular via at a certain diameter, the two corresponding data points from the 1.62:1 and 2:1 oval vias with equivalent contact surface areas are plotted. The circular via is positioned on a Cu line having a width of 120 rum. It should be apparent from FIG. 9 that when the circular via is replaced by the oval vias, the corresponding ratio of the via minor axis/line width is reduced below the via diameter/line width ratio, and can be further reduced by elongating the oval, as by increasing the major axis and/or reducing the minor axis. The circular via illustrated in FIG. 9 having a diameter of 90 nm corresponds to a via diameter/line width ratio of 0.75 which is within the steep slope of the peeling stress region of the plot illustrated in FIG. 4.

As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, scandium, platinum, magnesium aluminum or zirconium.

In accordance with embodiments of the present invention, Cu may be inlaid in a wide variety of dielectric materials employed as interlayer dielectrics. Advantageously, dielectric materials for use as interlayer dielectrics in accordance with embodiments of the present invention can comprise dielectric materials with lower values of permittivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyamides and BCB. Other suitable low-k dielectrics include poly(arylene)ethers, poly(arylene)ether azoles, arylene-N, polyamides, polynapthalene-N, polyphenylquinoxalines (PPQ), polyphenyleneoxide, polyethylene and polypropylene. Other low-k materials suitable for use in embodiments of the present invention include FO$_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and Halogen-doped (e.g., fluorine-doped) silicon dioxide derived from tetraethyl orthosilicate (TEOS) and fluorine-doped silicate glass (FSG).

Embodiments of the present invention enable the fabrication of semiconductor devices with Cu metallization levels having varying line widths with an attendant reduction in electromigration failures at the interface between the inlaid metallization and capping layer, e.g., silicon nitride, often via formation, with an attendant reduction in electromigration failures due to grain boundary diffusion. The present invention enjoys industrial applicability in manufacturing various types highly integrated semiconductor devices containing Cu metallization interconnection patterns. The present invention enjoys particular applicability in manufacturing flash memory semiconductor devices exhibiting increased circuit speed and sub-micron dimensions.

In the preceding description, the present invention is described with reference to specifically exemplary embodiments thereof It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A semiconductor device having an integrated circuitry pattern, the semiconductor device comprising:
    a dielectric layer in the integrated circuitry pattern, the dielectric layer having an opening therein;
    a copper (Cu) or a Cu alloy interconnect line in the integrated circuitry pattern, in the opening, the Cu or Cu alloy line having an end surface and a width ("LW") defined by first and second side surfaces;
    a capping layer on the Cu or Cu alloy line, in the integrated circuitry pattern; and
    a via in the integrated circuitry pattern, through the capping layer contacting the Cu or Cu alloy line, the via having the form of a solid rectangle in plan view having a width ("RW") substantially parallel to LW and being spaced apart from the end surface, or having the form of a solid oval in plan view having a minor axis ("MA") substantial parallel to LW,
    wherein the ratio RW:LW or MA:LW is less than or equal to about 0.7,
    wherein a first distance between a point on the perimeter of the via closest to the first side surface and a second distance between a point on the perimeter of the via closest to the second side surface are not equal,
    wherein a difference between the first distance and the second distance is not greater than about 10%, and
    wherein the via has a shape such that the ratio RW:LW or MA:LW is less than the ratio D:LW for a circular via having a diameter ("D") and an area equal to or less than the area of the via with the RW or MA.

2. The semiconductor device according to claim 1, wherein the ratio RW:LW or MA:LW is about 0.5 to about 0.7.

3. The semiconductor device according to claim 1, wherein the via is in the form of a solid rectangle in plan view.

4. The semiconductor device according to claim 1, wherein the via is in the form of a solid oval in plan view.

5. The semiconductor device according to claim 4, wherein the ratio of the major axis to the minor axis is about 2:1 or greater.

6. The semiconductor device according to claim 1, wherein the distance between the end surface and a point on the perimeter of the via closest to the end surface is greater than the first and second distances.

7. The semiconductor device according to claim 1, wherein the capping layer comprises a silicon nitride or a silicon carbide.

8. The semiconductor device according to claim 1, wherein the dielectric layer comprises a dielectric material having a dielectric constant no greater than about 3.9.

9. The semiconductor device according to claim 1, wherein the first and second side surfaces of the Cu or Cu alloy interconnect line are elongated sides of the Cu or Cu alloy interconnect line.

10. The semiconductor device according to claim 1, wherein the first and second side surfaces of the Cu or Cu alloy interconnect line are longer than the end surface of the Cu or Cu alloy interconnect line.

11. A semiconductor device comprising:
    a dielectric layer having an opening therein;
    a copper (Cu) or a Cu alloy line in the opening, the Cu or Cu alloy line having an end surface and a width ("LW") defined by first and second side surfaces;
    a capping layer on the Cu or Cu alloy line; and
    a via through the capping layer contacting the Cu or Cu alloy line, the via having a longest dimension ("LD") parallel to LW, wherein the via has a shape such that the ratio LD:LW is less than the ratio D:LW for a circular via having a diameter ("D") and an area equal to or less than the area of the via with the longest dimension.

12. The semiconductor device according to claim 11, wherein the ratio LD:LW is less than or equal to about 0.7.

13. The semiconductor device according to claim 12, wherein the ratio LD:LW is about 0.5 to about 0.7.

14. The semiconductor device according to claim 11, wherein the via is in the form of a rectangle having a width substantially parallel to LW, the width of the rectangle being LD.

15. The semiconductor device according to claim 11, wherein the via is in the form of an oval having a minor axis substantially parallel to LW, the minor axis being LD.

16. The semiconductor device according to claim 15, wherein the ratio of the major axis to the minor axis is about b 2:1 or greater.

17. The semiconductor device according to claim 11, wherein the ratio of the distance between a point on the perimeter of the via closest to the first side surface to the distance between a point on the perimeter of the via closest to the second side surface is about 0.9 to about 1.1.

18. The semiconductor device according to claim 17, wherein the ratio of the distance between the points on the perimeter of the via closest to each side surface is substantially the same.

19. The semiconductor device according to claim 17, wherein the distance between the end surface and point on the perimeter of the via closest to the end surface is greater than the distance between the points on the perimeter of the via closest to each side surface.

20. The semiconductor device according to claim 11, wherein the capping layer comprises silicon nitride or a silicon carbide.

* * * * *